United States Patent
Tsuzaki et al.

(10) Patent No.: US 8,115,539 B2
(45) Date of Patent: Feb. 14, 2012

(54) OPERATIONAL AMPLIFIER

(75) Inventors: Toshiyuki Tsuzaki, Chiba (JP); Akira Takeda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 10 days.

(21) Appl. No.: 12/887,862

(22) Filed: Sep. 22, 2010

(65) Prior Publication Data
US 2011/0074503 A1    Mar. 31, 2011

(30) Foreign Application Priority Data
Sep. 25, 2009  (JP) ................. 2009-221233

(51) Int. Cl.
*H03F 1/02* (2006.01)
(52) U.S. Cl. ........................ 330/9; 330/124 R
(58) Field of Classification Search ............. 330/124 R, 330/295, 9, 51; 327/124
See application file for complete search history.

(56) References Cited

U.S. PATENT DOCUMENTS
7,535,295 B1 * 5/2009 Huijsing et al. ............ 330/9
7,973,596 B2 * 7/2011 Eschauzier et al. .......... 330/9

FOREIGN PATENT DOCUMENTS
JP    03-117908 A    5/1991
* cited by examiner

*Primary Examiner* — Hieu Nguyen
(74) *Attorney, Agent, or Firm* — Brinks Hofer Gilson & Lione

(57) ABSTRACT

Provided is an operational amplifier capable of correcting an offset voltage of an element to be connected to an input terminal. The operational amplifier includes a main amplifier and an offset correction amplifier, which include input terminals connected in common. The main amplifier includes: a first transconductance amplifier for measurement; a second transconductance amplifier for offset correction; and a first capacitor connected to an input terminal of the second transconductance amplifier. The offset correction amplifier includes: a third transconductance amplifier for measurement; a fourth transconductance amplifier for offset correction; and a second capacitor connected to one input terminal of the fourth transconductance amplifier. An offset voltage adjustment circuit is provided to another input terminal of the fourth transconductance amplifier included in the offset correction amplifier.

3 Claims, 4 Drawing Sheets

OPERATIONAL AMPLIFIER

RELATED APPLICATIONS

This application claims priority under 35 U.S.C. §119 to Japanese Patent Application No. 2009-221233 filed on Sep. 25, 2009, the entire content of which is hereby incorporated by reference.

BACKGROUND OF THE INVENTION

1. Field of the Invention

The present invention relates to an operational amplifier, and more particularly, to an offset voltage cancellation made by an operational amplifier.

2. Description of the Related Art

In a semiconductor device that measures a minute voltage generated in a sensor element or the like, an operational amplifier is used for the purpose of amplifying the minute voltage. In order to perform highly precise measurement, it is necessary to reduce an influence of an offset voltage, which is one of the typical error factors of the operational amplifier. As a technology of reducing the offset voltage, an operational amplifier provided with an offset voltage cancellation function of self-correcting the offset voltage has been devised.

The conventional operational amplifier provided with the offset voltage cancellation function includes a main operational amplifier and a correction operational amplifier, in which an offset voltage of the main operational amplifier is measured and corrected to thereby correct the offset voltage (see, for example, Japanese Patent Application Laid-open No. Hei 03-117908).

FIG. 4 is a circuit diagram of the conventional offset voltage canceling operational amplifier. A main amplifier 117 is connected to a non-inverting input terminal 101 and an inverting input terminal 102, and includes transconductance amplifiers 107 and 108 and a transimpedance amplifier 113. The transconductance amplifier 108 has a non-inverting input terminal connected to a capacitor 111. A correction amplifier 118 is connected to the inverting input terminal 102 and the non-inverting input terminal 101 via a switch 103, and includes transconductance amplifiers 109 and 110 and a transimpedance amplifier 114. A switch 104 is connected between two input terminals of the transconductance amplifier 109. The transconductance amplifier 110 has a inverting input terminal connected to a capacitor 112. The transimpedance amplifier 114 has an output terminal 120 connected to the capacitor 111 via a switch 115 and to the capacitor 112 via a switch 116. The main amplifier 117 has an offset voltage 105 at its input terminal. The correction amplifier 118 has an offset voltage 106 at its input terminal.

The switches 103 and 115 are connected in a clock $\Phi 2$ mode. The switches 104 and 116 are connected in a clock $\Phi 1$ mode. The clock $\Phi 1$ mode is a mode of correcting the offset voltage 106 of the correction amplifier 118. The clock $\Phi 2$ mode is a mode of correcting the offset voltage 105 of the main amplifier 117.

The offset voltage canceling operational amplifier of FIG. 4 alternately performs the clock $\Phi 1$ mode and the clock $\Phi 2$ mode to thereby correct the offset voltage 105 of the main amplifier 117 by means of the correction amplifier 118.

Next, an operation of the offset voltage canceling operational amplifier of FIG. 4 is described. Hereinafter, a transconductance of the transconductance amplifier and a transimpedance of the transimpedance amplifier are represented by gm and R, respectively.

In the clock $\Phi 1$ mode, a value of the offset voltage 106 (Voff,n) of the correction amplifier 118 is measured by the transconductance amplifier 109, and information on the value is stored in the capacitor 112. An output voltage (Vout,n) of the output terminal 120 of the correction amplifier 118 is expressed by the following expression.

$$Vout,n=(Voff,n \times gm3 - Vout,n \times gm4) \times Rn = Voff,n \times gm3 \times Rn/(1+gm4 \times Rn) \approx Voff,n \times gm3/gm4$$

Accordingly, in the clock $\Phi 1$ mode, a voltage of "Voff,n× gm3/gm4" is stored in the capacitor 112.

In the clock $\Phi 2$ mode, a value of the offset voltage 105 (Voff,m) of the main amplifier 117 is measured by the correction amplifier 118, and information on the value is stored in the capacitor 111. At this time, the value of the offset voltage 106 of the correction amplifier 118 is stored in the capacitor 112. In a case where the non-inverting input terminal 101 is supplied with a voltage (Vin) and the inverting input terminal 102 is supplied with a voltage fed back from an output terminal 119 of the main amplifier 117 with a feedback factor β, an output voltage (Vout,m) of the output terminal 119 of the main amplifier 117 is expressed by the following expression.

$$Vout,m = \{(Vin - \beta \times Vout,m + Voff,m) \times gm1 + [(Vin - \beta \times Vout,m + Voff,n) \times gm3 - (Voff,n \times gm3/gm4) \times gm4] \times Rn \times gm2\} \times Rm = (gm1 + gm2 \times gm3 \times Rn) \times Rm \times Vin/[1+\beta \times Rm \times (gm1+gm2 \times gm3 \times Rn)] + (gm1 \times Rm \times Voff,m)/[1+\beta \times Rm \times (gm1+gm2 \times gm3 \times Rn)]$$

Here, when "gm1=gm2=gm3=gm4=gm" is satisfied, the following expression is satisfied.

$$Vout,m \approx [Vin + Voff,m/(gm \times Rn)]/\beta$$

As is apparent from the above expression, an influence of the offset voltage 106 (Voff,n) of the correction amplifier 118 is eliminated, and the offset voltage 105 (Voff,m) of the main amplifier 117 takes a value of "1/(gm×Rn)" so that an influence thereof is reduced significantly.

Therefore, the conventional offset voltage canceling operational amplifier is capable of canceling its own offset voltage. Further, the offset voltage has temperature characteristics, but the temperature characteristics may be canceled similarly.

A sensor element to be connected to an operational amplifier has an offset voltage and temperature characteristics different depending on individual sensor elements. For that reason, measurement precision cannot be improved without canceling the offset voltage and temperature characteristics of the sensor element.

The conventional offset voltage canceling operational amplifier is capable of reducing its own offset voltage and temperature characteristics, but incapable of canceling the offset voltage and temperature characteristics of the sensor element.

SUMMARY OF THE INVENTION

The present invention has been devised to solve the above-mentioned problem, and has an object to provide an offset voltage canceling operational amplifier with high measurement precision which is capable of canceling an offset voltage and temperature characteristics of a sensor element.

In order to solve the conventional problem, an offset voltage canceling operational amplifier according to the present invention is configured as follows.

That is, the operational amplifier includes: a main amplifier; and an offset correction amplifier, the main amplifier and the offset correction amplifier including input terminals connected in common, in which the main amplifier includes: a first transconductance amplifier for measurement; a second transconductance amplifier for offset correction; and a first capacitor connected to an input terminal of the second transconductance amplifier, the offset correction amplifier includes: a third transconductance amplifier for measurement; a fourth transconductance amplifier for offset correction; and a second capacitor connected to one input terminal of the fourth transconductance amplifier, and the operational amplifier further includes an offset voltage adjustment circuit provided to another input terminal of the fourth transconductance amplifier of the offset correction amplifier, to thereby correct an offset of an element to be connected to the input terminal.

The offset voltage canceling operational amplifier according to the present invention is capable of canceling its offset voltage depending on an offset voltage or temperature characteristics of a sensor element to be connected. Therefore, an offset voltage canceling operational amplifier with high measurement precision may be provided.

DETAILED DESCRIPTION OF THE PREFERRED EMBODIMENTS

Referring to the accompanying drawings, an offset voltage canceling operational amplifier according to the present invention is described below.

Figure 1:
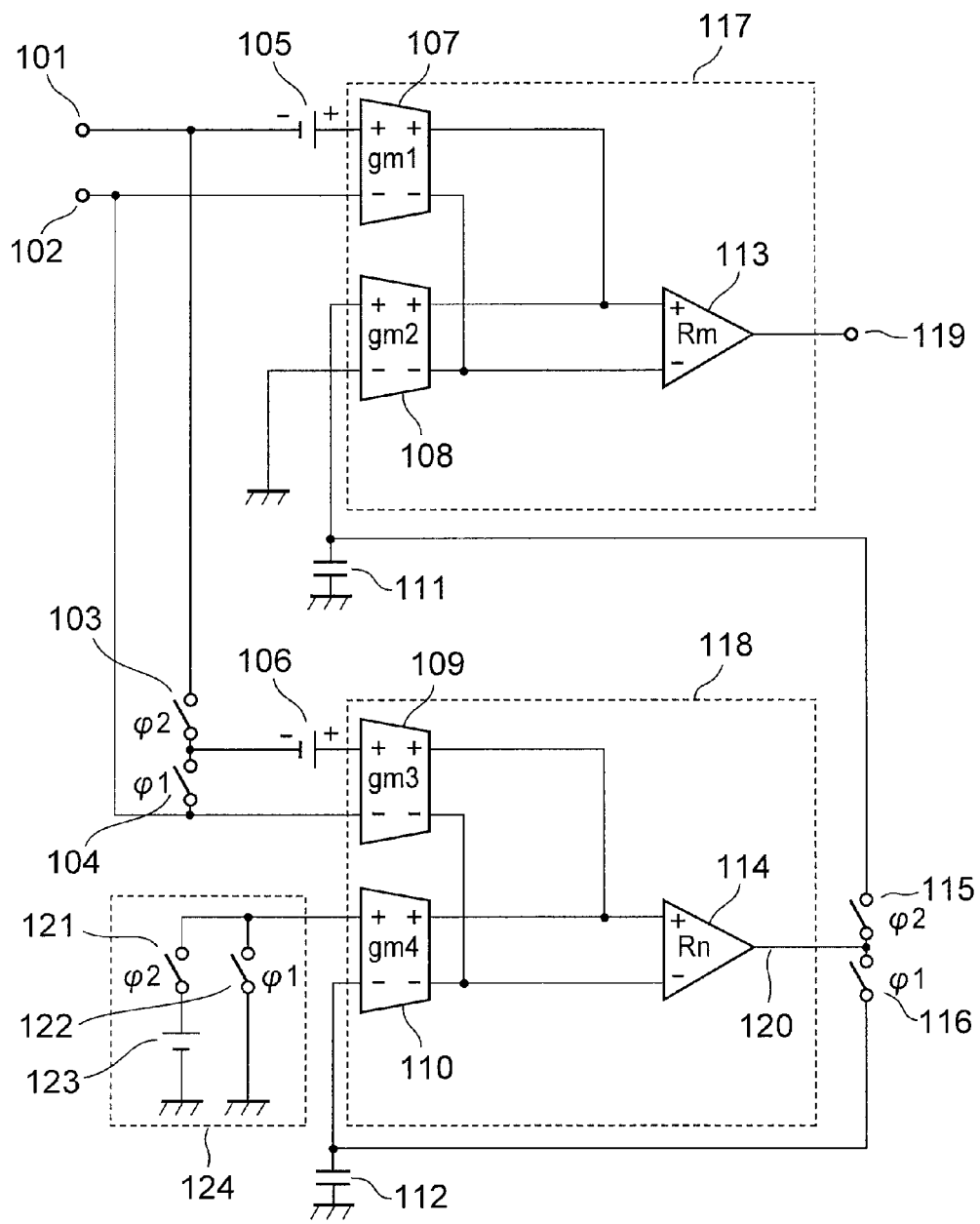
FIG. 1 is a circuit diagram of an offset voltage canceling operational amplifier according to the present invention.

FIG. 1 is a circuit diagram of the offset voltage canceling operational amplifier according to the present invention. A main amplifier 117 is connected to a non-inverting input terminal 101 and an inverting input terminal 102, and includes transconductance amplifiers 107 and 108 and a transimpedance amplifier 113. The transconductance amplifier 108 has a non-inverting input terminal connected to a capacitor 111. A correction amplifier 118 is connected to the inverting input terminal 102 and the non-inverting input terminal 101 via a switch 103, and includes transconductance amplifiers 109 and 110 and a transimpedance amplifier 114. A switch 104 is connected between two input terminals of the transconductance amplifier 109. The transconductance amplifier 110 has a non-inverting input terminal connected to an offset voltage adjustment circuit 124, and an inverting input terminal connected to a capacitor 112. The transimpedance amplifier 114 has an output terminal 120 connected to the capacitor 111 via a switch 115 and to the capacitor 112 via a switch 116. The main amplifier 117 has an offset voltage 105 at its input terminal. The correction amplifier 118 has an offset voltage 106 at its input terminal.

The offset voltage adjustment circuit 124 includes switches 121 and 122 and a voltage source 123. The voltage source 123 is connected to an output terminal of the offset voltage adjustment circuit 124 via the switch 121. The switch 122 is connected between a ground (GND) and the output terminal. Accordingly, when the switches 121 and 122 are switched, one of a voltage of the voltage source 123 and a voltage of GND is input to the non-inverting input terminal of the transconductance amplifier 110.

The switches 103, 115, and 121 are connected in a clock Φ2 mode. The switches 104, 116, and 122 are connected in a clock Φ1 mode. The clock Φ1 mode is a mode of correcting the offset voltage 106 of the correction amplifier 118. The clock Φ2 mode is a mode of correcting the offset voltage 105 of the main amplifier 117.

The offset voltage canceling operational amplifier of FIG. 1 alternately performs the clock Φ1 mode and the clock Φ2 mode to thereby correct the offset voltage 105 of the main amplifier 117 by means of the correction amplifier 118.

Next, an operation of the offset voltage canceling operational amplifier of FIG. 1 is described. Hereinafter, a transconductance of the transconductance amplifier and a transimpedance of the transimpedance amplifier are represented by gm and R, respectively.

Figure 2:
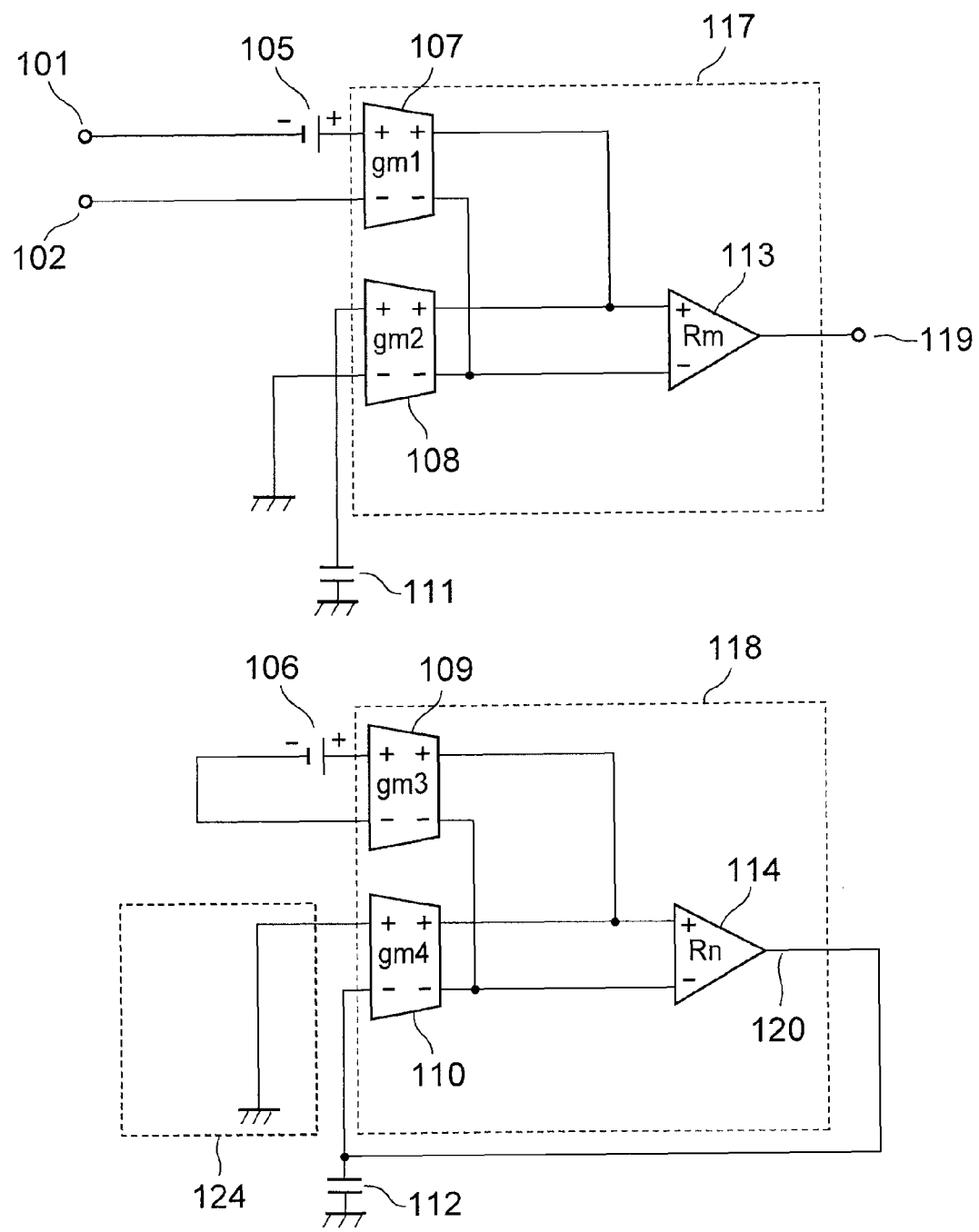
FIG. 2 is a circuit diagram illustrating a clock Φ1 mode of the offset voltage canceling operational amplifier of FIG. 1.

FIG. 2 is a circuit diagram illustrating the clock Φ1 mode. In the clock Φ1 mode, a value of the offset voltage 106 (Voff,n) of the correction amplifier 118 is measured by the transconductance amplifier 109, and information on the value is stored in the capacitor 112.

An output voltage (Vout,n) of the output terminal 120 of the correction amplifier 118 is expressed by the following expression.

$$Vout,n = (Voff,n \times gm3 - Vout,n \times gm4) \times Rn = Voff,n \times gm3 \times Rn/(1+gm4 \times Rn) \approx Voff,n \times gm3/gm4$$

Accordingly, in the clock Φ1 mode, a voltage of "Voff,n× gm3/gm4" is stored in the capacitor 112.

Figure 3:
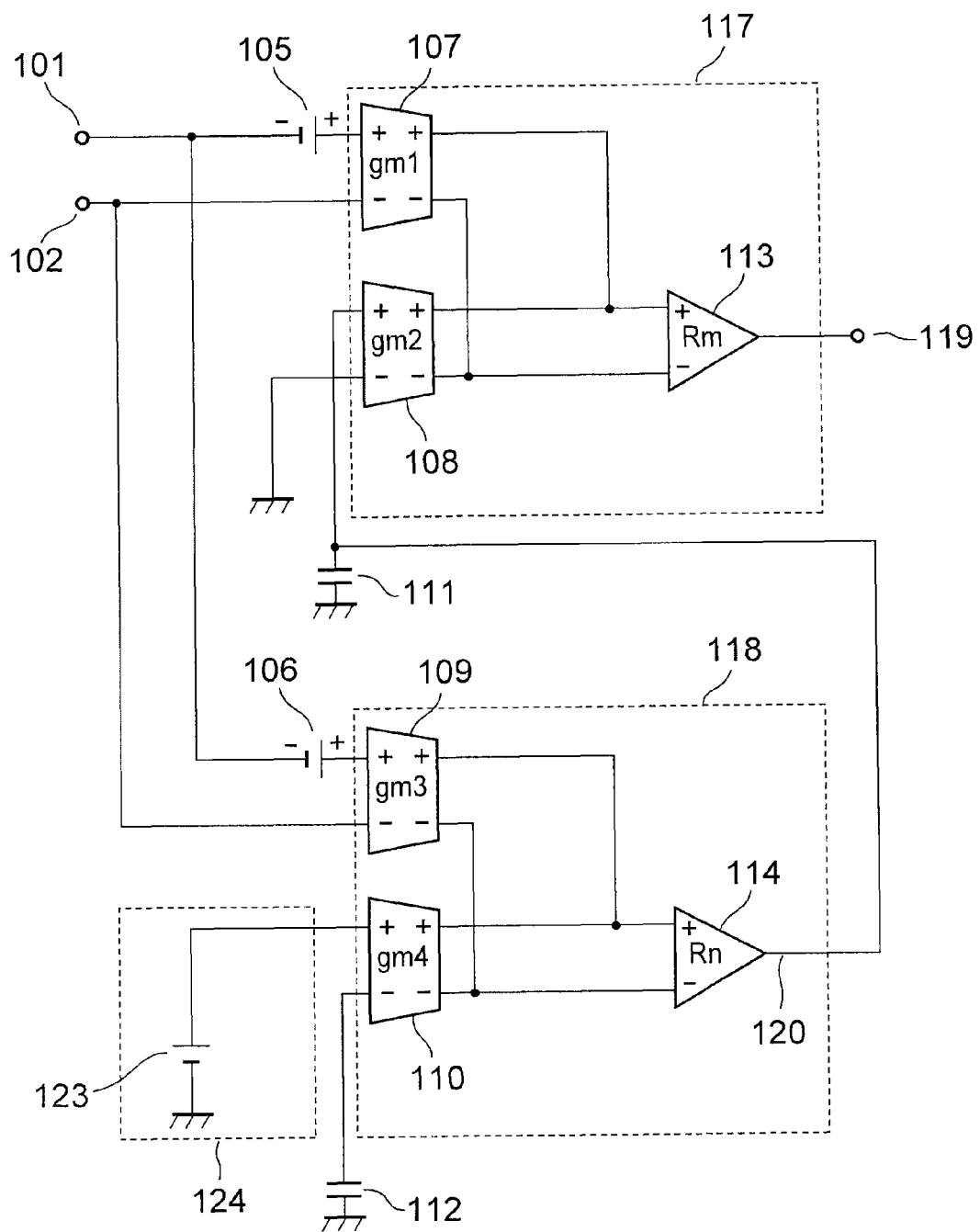
FIG. 3 is a circuit diagram illustrating a clock Φ2 mode of the offset voltage canceling operational amplifier of FIG. 1.
Figure 4:
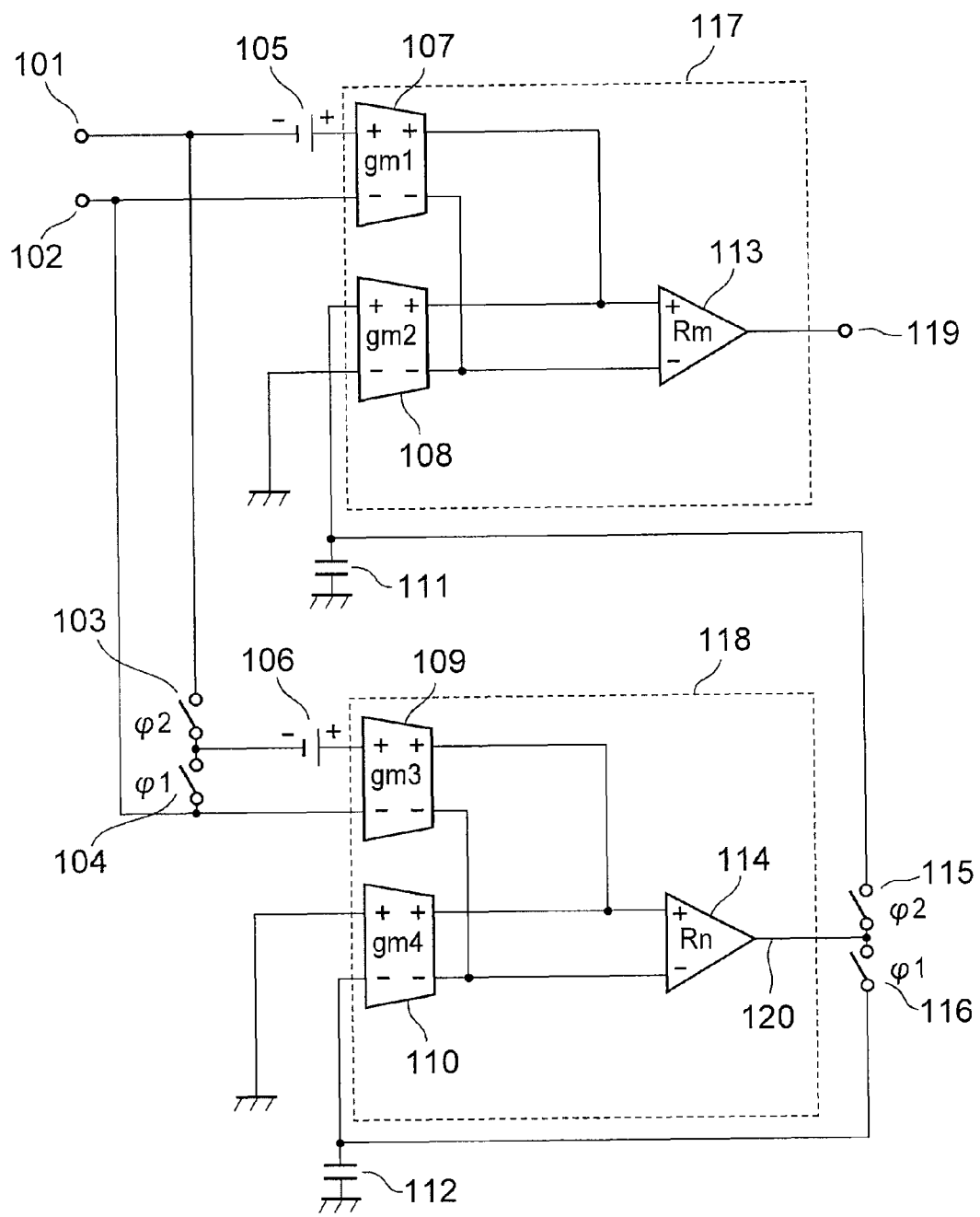
FIG. 4 is a circuit diagram of a conventional offset voltage canceling operational amplifier.

FIG. 3 is a circuit diagram illustrating the clock Φ2 mode. In the clock Φ2 mode, a value of the offset voltage 105 (Voff,m) of the main amplifier 117 is measured by the correction amplifier 118, and information on the value is stored in the capacitor 111. At this time, the value of the offset voltage 106 of the correction amplifier 118 is stored in the capacitor 112. Connected to the non-inverting input terminal of the transconductance amplifier 110 is a voltage (Vc) of the voltage source 123.

In a case where the non-inverting input terminal 101 is supplied with a voltage (Vin) and the inverting input terminal 102 is supplied with a voltage fed back from an output terminal 119 of the main amplifier 117 with a feedback factor β, an output voltage (Vout,m) of the output terminal 119 of the main amplifier 117 is expressed by the following expression.

$$Vout,m = \{(Vin - \beta \times Vout,m + Voff,m) \times gm1 + [(Vin - \beta \times Vout,m + Voff,n) \times gm3 - (Voff,n \times gm3/gm4 - Vc) \times gm4] \times Rn \times gm2\} \times Rm = (gm1 + gm2 \times gm3 \times Rn) \times Rm \times Vin/[1 + \beta \times Rm \times (gm1 + gm2 \times gm3 \times Rn)] + (gm1 \times Rm \times Voff,m + Vc \times gm2 \times gm3 \times Rn)/[1 + \beta \times Rm \times (gm1 + gm2 \times gm3 \times Rn)]$$

Here, when "gm1=gm2=gm3=gm4=gm" is satisfied, the following expression is satisfied.

$$Vout,m \approx [Vin + Voff,m/(gm \times Rn) + Vc]/\beta$$

As is apparent from the above expression, an influence of the offset voltage 106 (Voff,n) of the correction amplifier 118 is eliminated so that an influence of the offset voltage 105 (Voff, m) of the main amplifier 117 is reduced significantly. Then, the voltage (Vc) of the voltage source 123 is added to the offset voltage 105. Therefore, through the adjustment to the voltage (Vc) of the voltage source 123, the offset voltage canceling operational amplifier may be provided with an offset voltage adjustment function.

As described above, through the adjustment to the voltage (Vc) of the voltage source 123, the offset voltage value may be adjusted to cancel an offset voltage of a sensor element to be connected. Further, when temperature characteristics of the voltage (Vc) of the voltage source 123 are set so as to cancel temperature characteristics of the sensor element to be connected, the temperature characteristics of the sensor element may be canceled.

Note that, in FIG. 1 where the voltage source 123 is connected to the non-inverting input terminal of the transconductance amplifier 110, the same approach holds true for the capacitor 112 connected to the inverting input terminal thereof. In the clock Φ2 mode, charges are stored/removed in/from the capacitor 112 to change its voltage, to thereby cancel the offset voltage and temperature characteristics of the sensor element.

What is claimed is:

1. An operational amplifier, comprising:
a main amplifier; and
an offset correction amplifier,
the main amplifier and the offset correction amplifier including input terminals connected in common,
wherein the main amplifier comprises:
a first transconductance amplifier for measurement;
a second transconductance amplifier for offset correction; and
a first capacitor connected to an input terminal of the second transconductance amplifier,
wherein the offset correction amplifier comprises:
a third transconductance amplifier for measurement;
a fourth transconductance amplifier for offset correction; and
a second capacitor connected to one input terminal of the fourth transconductance amplifier,
the offset correction amplifier including an output terminal connected to the first capacitor, and
wherein the operational amplifier further comprises an offset voltage adjustment circuit provided to another input terminal of the fourth transconductance amplifier of the offset correction amplifier, to thereby correct an offset of an element to be connected to the input terminal.

2. An operational amplifier according to claim 1, further comprising:
a first switch provided between one input terminal and another input terminal of the third transconductance amplifier; and
a second switch provided between one input terminal of the first transconductance amplifier and the one input terminal of the third transconductance amplifier,
wherein the offset correction amplifier further comprises:
a third switch provided between the output terminal and the second capacitor; and
a fourth switch provided between the output terminal and the first capacitor,
wherein the offset voltage adjustment circuit comprises:
a voltage source;
a fifth switch connected to GND; and
a sixth switch connected to the voltage source, and
wherein the first switch, the third switch, and the fifth switch are opened/closed simultaneously, and the second switch, the fourth switch, and the sixth switch are opened/closed simultaneously.

3. An operational amplifier, comprising:
a main amplifier; and
an offset correction amplifier,
the main amplifier and the offset correction amplifier including input terminals connected in common,
wherein the main amplifier comprises:
a first transconductance amplifier for measurement;
a second transconductance amplifier for offset correction; and
a first capacitor connected to an input terminal of the second transconductance amplifier,
wherein the offset correction amplifier comprises:
a third transconductance amplifier for measurement;
a fourth transconductance amplifier for offset correction; and
a second capacitor connected to one input terminal of the fourth transconductance amplifier,
the offset correction amplifier including an output terminal connected to the first capacitor, and
wherein the operational amplifier further comprises an offset voltage adjustment circuit connected to the second capacitor, to thereby correct an offset of an element to be connected to the input terminal.

* * * * *